United States Patent
Satoh et al.

(10) Patent No.: US 6,756,271 B1
(45) Date of Patent: Jun. 29, 2004

(54) SIMPLIFIED TWIN MONOS FABRICATION METHOD WITH THREE EXTRA MASKS TO STANDARD CMOS

(75) Inventors: Kimihiro Satoh, Hopewell Jct, NY (US); Tomoya Saito, Beacon, NY (US); Seiki Ogura, Hopewell Jct, NY (US)

(73) Assignee: Halo LSI, Inc., Wappinger Falls, NY (US)

( * ) Notice: Subject to any disclaimer, the term of this patent is extended or adjusted under 35 U.S.C. 154(b) by 0 days.

(21) Appl. No.: 10/386,853

(22) Filed: Mar. 12, 2003

Related U.S. Application Data

(60) Provisional application No. 60/400,310, filed on Aug. 1, 2002, and provisional application No. 60/363,448, filed on Mar. 12, 2002.

(51) Int. Cl.⁷ .......................................... H01L 21/8247
(52) U.S. Cl. ...................................... 438/258; 438/954
(58) Field of Search .............................. 438/257–267, 438/954

(56) References Cited

U.S. PATENT DOCUMENTS

| | | | |
|---|---|---|---|
| 6,248,633 B1 | 6/2001 | Ogura et al. | 438/267 |
| 6,255,166 B1 | 7/2001 | Ogura et al. | 438/257 |
| 6,434,053 B1 | 8/2002 | Fujiwara | 365/185.28 |
| 6,469,935 B2 | 10/2002 | Hayashi | 365/185.18 |
| 6,512,691 B2 | 1/2003 | Hsu et al. | 365/185.05 |
| 6,531,350 B2 | 3/2003 | Satoh et al. | 438/197 |

OTHER PUBLICATIONS

E. Suzuki et al., "A Low–Voltage Alterable EEPROM with Metal–Oxide–Nitride–Oxide–Semiconductor (MONOS) Structures," IEEE Transaction on Electron Devices, vol. ED–30, Feb. 1983, pp. 122–128.

*Primary Examiner*—Richard A. Booth
(74) *Attorney, Agent, or Firm*—George O. Saile; Stephen B. Ackerman; Rosemary L. S. Pike

(57) ABSTRACT

The invention proposes to simplify fabrication of the twin MONOS memory array. The twin MONOS memory array can be embedded into a standard CMOS circuit by the process of the present invention by adding only three additional mask levels. Conventional floating gate devices need ten or more extra masks. In the present invention, the unique twin MONOS process steps can be inserted into the standard CMOS process flow without any parameter modifications. The present invention also achieves increased endurance by means of reducing the widths of the sidewall control gate and underlying nitride storage region.

56 Claims, 13 Drawing Sheets

SIMPLIFIED TWIN MONOS FABRICATION METHOD WITH THREE EXTRA MASKS TO STANDARD CMOS

This application claims priority to U.S. Provisional Patent Application serial No. 60/363,448, filed on Mar. 12, 2002 and U.S. Provisional Patent Application serial No. 60/400,310, filed on Aug. 1, 2002, which are herein incorporated by reference.

BACKGROUND OF THE INVENTION

1. Field of the Invention

The present invention relates to twin MONOS memory and more particularly to twin MONOS memory either embedded in CMOS circuits or in a stand-alone application, and its fabrication method.

2. Description of the Related Art

A MONOS memory is one of typical semiconductor memories wherein carrier charge is stored in a gate insulator to have information nonvolatilely stored. The MONOS memory is of a laminated structure comprising a conductive gate (M), a top oxide film (O), a silicon nitride film (N), a tunnel oxide film (O) and a semiconductor wherein the carrier (electron or hole) is captured at a trapping level in the silicon nitride film to store the carrier charge A MONOS memory is disclosed as the nonvolatile memory capable of reducing the programming voltage by E. Suzuki, H. Hiraishi, K. Ishii and Y. Hayashi, "A Low-Voltage Alterable EEPROM with Metal-Oxide-nitride-Oxide and semiconductor (MONOS) Structures", in IEEE Transaction on Electron Devices, Vol. ED-30, February 1983, p. 122). This MONOS memory is of a laminated structure comprising a conductive gate (M), a top oxide film (O), a silicon nitride film (N), a tunnel oxide film (O) and semiconductor. This structure has enabled the MONOS memory to stop hopping via the carrier trapping level in the silicon nitride film due to a potential barrier formed between the nitride film and the top oxide film, which resulted in making the nitride film as thin as possible. Further, carrier traps newly generated at the interface between the top oxide film and nitride film has enlarged a memory window to the extent it is possible to identify the stored information even if the entire insulator thickness is made thinner.

Twin MONOS individual cell structure was introduced in U.S. Pat. No. 6,255,166 to Seiki Ogura issued on Jul. 3, 2001. Its fabrication method was presented in U.S. patent application Ser. No. 09/994,084 to Ogura et al filed on Nov. 21, 2001. This invention also refers to an array structure of 4 bit-1 contact described in U.S. Pat. No. 6,469,935 to Hayashi et al issued Oct. 22, 2002, where four memory storage cells share one contact. These patents are herein incorporated by reference.

SUMMARY OF THE INVENTION

The invention proposes to simplify fabrication of the twin MONOS memory array. The twin MONOS memory array can be embedded into a standard CMOS circuit by the process of the present invention by adding only three additional mask levels. Conventional floating gate devices need ten or more extra masks. In the present invention, the unique twin MONOS process steps can be inserted into the standard CMOS process flow without any parameter modifications. The present invention also achieves increased endurance by means of reducing the widths of the sidewall control gate and underlying nitride storage region.

The twin MONOS fabrication method described prior to the present invention, such as in Ser. No. 09/994,084 requires a capping nitride layer with a thickness of between about 100 and 200 nm over the memory word gate, as shown in FIG. 2. It works as an etch stopper during chemical mechanical polishing (CMP) and enables the self-aligned word line wiring and/or self-aligned contact. Recently, salicidation over the CMOS gate polysilicon has become standard practice to reduce resistance. The capping nitride layer blocks salicidation so that the nitride over the CMOS gate polysilicon must be removed before the salicidation process. In this case, a mask is necessary to prevent removal of the capping nitride layer in the memory area. In the memory area, the capping nitride layer causes other problems. The structure of the 4 bit-1 contact memory array, such as described in U.S. Pat. No. 6,469,935, does not need to expose the word line after CMP, so this structure does not have the capping nitride layer as a CMP etch stopper. The present invention proposes the elimination of the capping nitride layer over the gate polysilicon so that the nitride stripping mask is no longer necessary.

Any applied voltage during the twin MONOS device operation does not exceed 5V on the control gate during program operation. Therefore, the thick gate oxide as used in floating gate memory is not necessary. The gate oxides in the memory area can be the same as the CMOS oxides. Thus, no extra mask for the gate oxide in the memory area is needed.

The channel implantation under the control gate and memory LDD are maskless. Since the CMOS gate is patterned after the memory gate, the CMOS region is covered with the gate polysilicon and is not exposed to the memory implantations. The memory source/drain implantation is shared with the CMOS NMOS devices. No extra mask process is necessary for memory implantations.

The ultra short channel under the memory control gate is controlled by reducing the thickness of the control gate polysilicon to about 45 nm instead of using the disposable sidewall process as taught in Ser. No. 09/994,084. This not only simplifies the process, but also significantly improves the erase efficiency with hot hole injection. The spacer to define the offset to source/drain is shared with the CMOS process.

The present invention optimizes the extra mask steps added to the CMOS process to only 3:

1) Deep N-well mask to enable negative voltage application on NMOS,
2) Memory gate mask to define memory word gates, and
3) Memory control gate mask to form control gate contacts.

The present invention provides a simplified fabrication method to lower manufacturing costs.

DETAILED DESCRIPTION OF THE PREFERRED EMBODIMENTS

Figure 1:
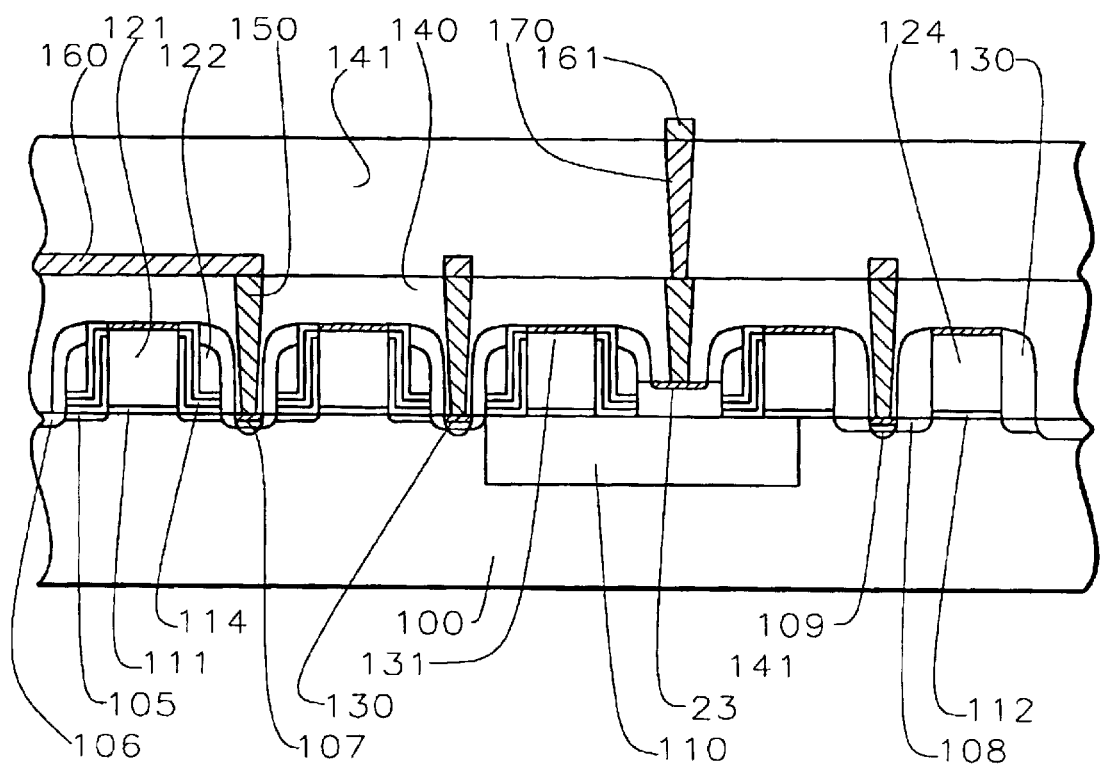
FIG. 1 shows a completed device of the present invention.
Figure 2:
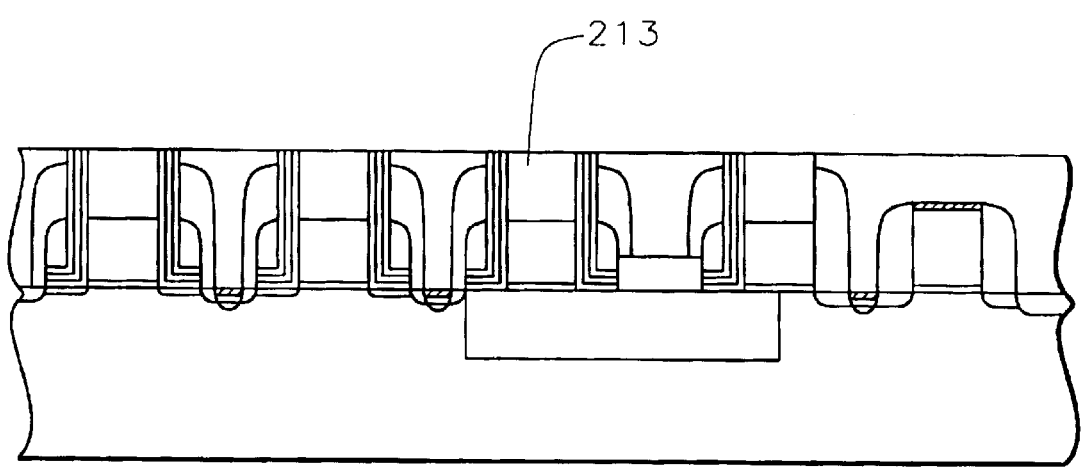
FIG. 2 shows a layout of the prior art.

The process of the present invention forms a twin MONOS memory embedded in a CMOS device, as illustrated in FIG. 1. A memory area is shown on the left side of the figure and a CMOS area is shown on the right side. The memory and CMOS areas are separated by an isolation region in a substrate, such as STI 110. A deep N-well is formed in the NMOS area and in the memory area to supply negative voltage. The deep N-well is not shown. Polysilicon memory word gates 121 are shown in the memory area having silicon control gates 122 on sidewalls of the memory gates and having an oxide-nitride-oxide (ONO) layer 114 therebetween wherein the ONO layer also underlies the control gates and overlies a gate oxide layer 111 wherein the nitride portion of the ONO layer underlying the control gates provides storage in the memory area. A channel length of the control gates is less than 50 nm and the control gates have a height of at least 50 nm less than a height of the memory gates. Polysilicon CMOS gates 124 are shown in the CMOS area. A polysilicon control gate contact 123 lies between the memory area and the CMOS area overlying the substrate and on a sidewall of a CMOS gate in the CMOS area and on a sidewall of a memory gate in the memory area. LDD regions 106 and 108 and source and drain regions I 107 and 109 are shown in the substrate adjacent to the gates in the CMOS area and in the memory area, respectively. Metal contacts 150 are formed through a dielectric layer 140/141 overlying the gates to the source and drain regions forming word line contacts 106 and control gate contacts 161 to complete the Twin MONOS memory device.

An example of the process flow to be proposed in this invention is shown in Table 1. In column CMOS/Memory, 'C' indicates a CMOS process and 'M' indicates a process unique to memory formation. Extra mask steps are marked with an 'X' in the Extra Mask column.

TABLE 1

| PROCESS STEP | PROCESS DESCRIPTION | CMOS MEMORY | EXTRA MASK |
|---|---|---|---|
| STI | CMOS shallow trench isolation | C | |
| Deep N-Well | Triple well - Deeper N-well | M | X |
| N-well | CMOS N-well, PMOS | C | |
| P-well | CMOS P-well, NMOS | C | |
| Oxide 1 | Dual Gate Oxide, first oxidation | C | |
| P-channel implant | P-channel implant to define P-Vt | C | |
| N-channel implant | N-channel implant to define P-Vt | C | |
| Oxide 2 | Thin gate, thick gate increment | C | |
| Poly deposition | Gate polysilicon | C | |
| Memory mask | Memory gate mask | M | X |
| Control gate channel implant | Boron implant (self-aligned no mask) | M | |
| ONO deposition | Memory storage | M | |
| Sidewall gate | Control gate, control gate contact | M | X |
| Memory LDD implant | N-type dopant (self-aligned no mask) | M | |

TABLE 1-continued

| PROCESS STEP | PROCESS DESCRIPTION | CMOS MEMORY | EXTRA MASK |
|---|---|---|---|
| CMOS poly mask | CMOS gate mask | C | |
| N-channel LDD | CMOS N-channel LDD | C | |
| P-channel LDD | CMOS P-channel LDD | C | |
| Spacer process | CMOS LDD to Source/Drain offset | C | |
| N Source/drain implant | CMOS N-channel source/drain implant | C | |
| P Source/drain implant | CMOS P-channel source/drain implant | C | |
| Salicide | Salicidation | C | |
| Contact oxide | FET devices metal isolation | C | |
| Contact | Contact hole and stud | C | |
| Metal 1 | Metal wiring 1 | C | |
| Via 1 | Interlayer dielectrics and via hole | C | |
| Metal 2 | Second metal | C | |

Figure 3:
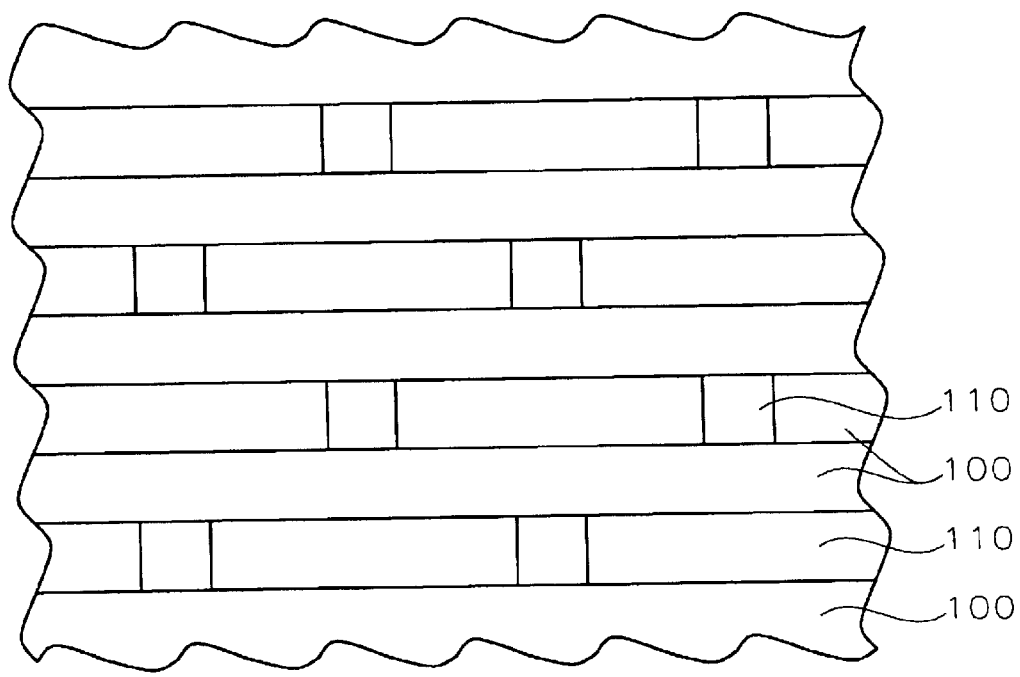
FIGS. 3 and 4 show a top view of the layout of the present invention.
Figure 4:
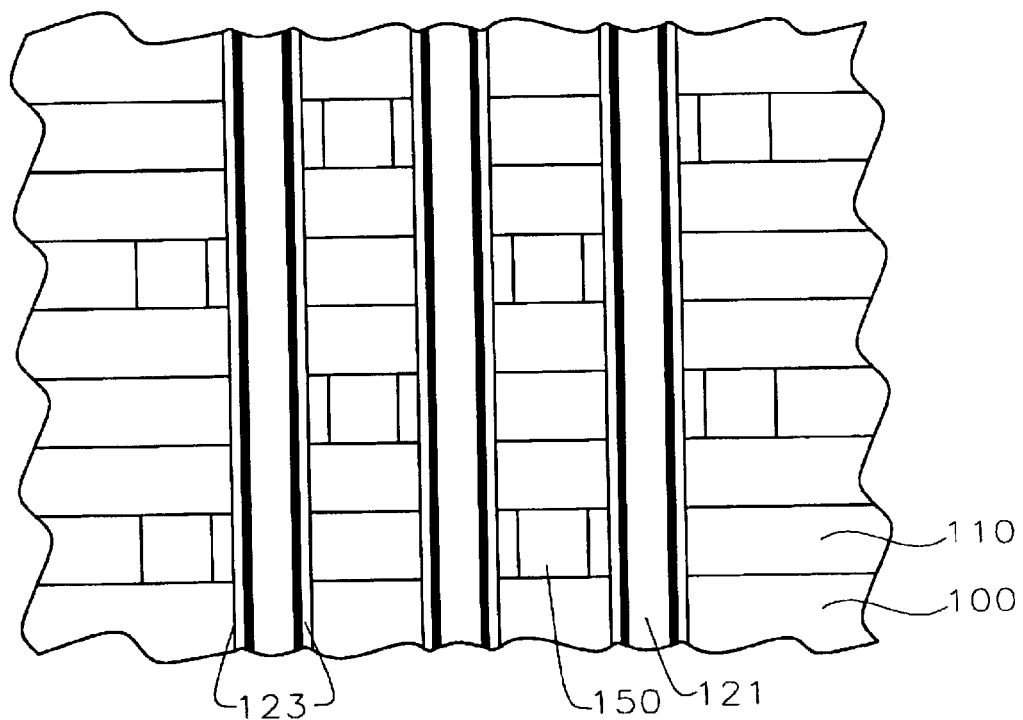

Shallow trench isolation (STI) is formed as shown in FIG. 3 with a conventional CMOS process as if laying blocks. FIG. 3 shows a top view of active areas 100 and STI areas 110. FIG. 4 helps understand how the memory word line 121 and control gate 123 run relative to the STI/active area layout. An ONO stack film runs under the control gate and has a memory element over the active area. Four adjacent cells will share a contact 150.

Figure 5:
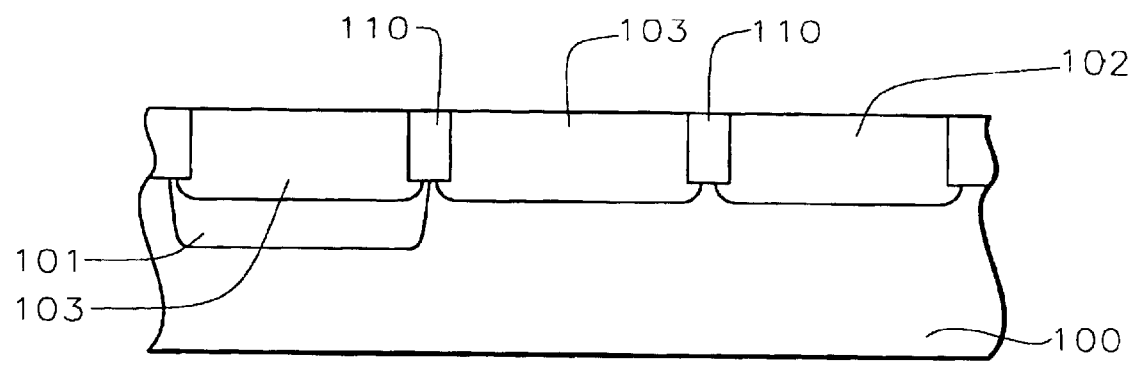
FIGS. 5 through 19 show the process flow of the present invention in cross-section.
Figure 6:
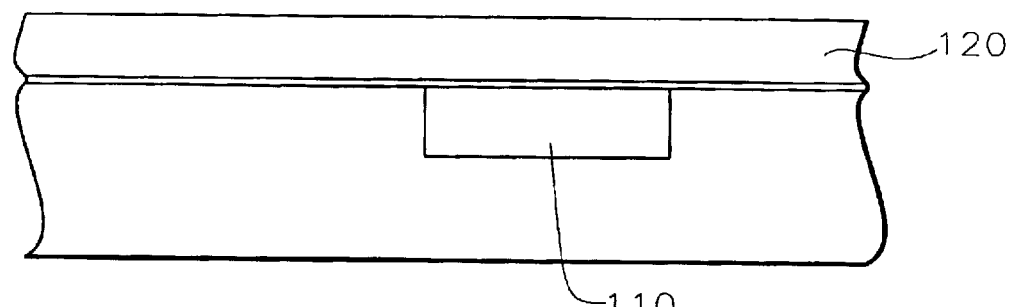

A triple well structure is required in addition to the conventional N-well 102 and P-well 103 structures isolated by STI 110 as shown in FIG. 5 to supply negative voltage to N-MOS devices in the well. After patterning the resist with deep N-well 101 mask, phosphorus is implanted with the energy of between about 1.5 MeV and 3 MeV to between the depth of 1 $\mu$m and 4 $\mu$m, twice the depth of the overlying P-well 103. The P-well in the triple well is formed as is conventional. The memory device is built over the P-well as shown in FIG. 6 or the triple well to supply negative voltage to the well. NMOS and PMOS are built over the P-well and N-well, respectively. When negative voltage is required for P-well, a triple well is necessary.

The first oxidation, N-channel implant to adjust the PMOS threshold voltage, P-channel threshold voltage (Vt) adjustment, and second oxidation process are standard CMOS parameters. These steps are followed by gate polysilicon deposition to a thickness of between about 100 and 250 nm. The cap nitride is not deposited over the polysilicon. While the gate polysilicon 120, shown in FIG. 6, is shared between the twin MONOS memory and the CMOS circuit, it is patterned separately. The extra mask to print the memory gate pattern is necessary.

Figure 7:
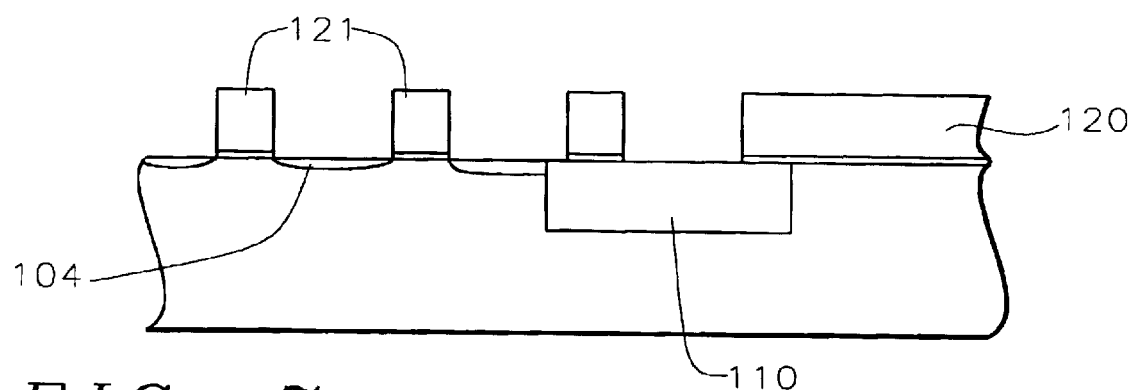

The memory gate 121 is defined with a conventional lithography as shown in FIG. 7. The logic gate is masked and the polysilicon 120 remains. Boron is implanted with a dose of between about 1E12 and 1E13 ions/cm$^2$ into control gate channel 104 to adjust the Vt under the control gate without any mask since the remaining gate polysilicon over the CMOS regions blocks the area.

Figure 8:
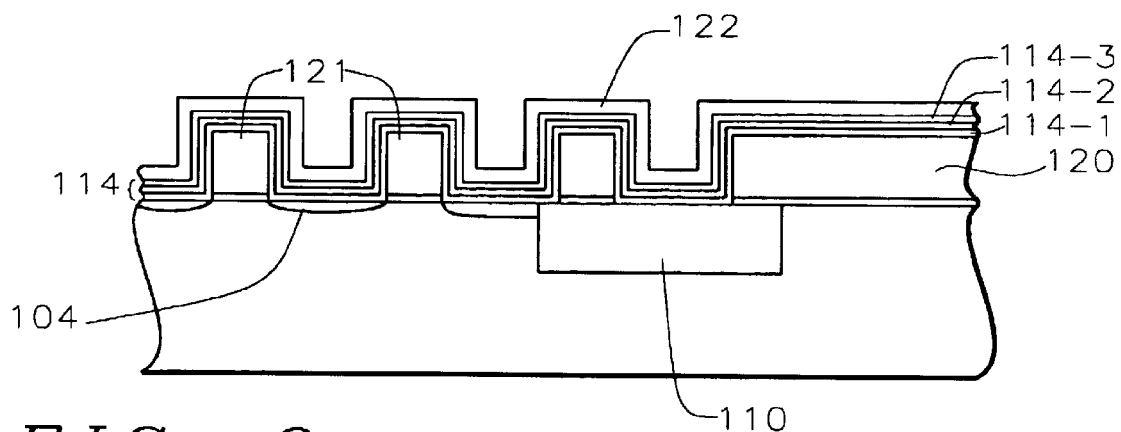

An ONO stack film as a memory storage element 114 in FIG. 8 is composed of the base oxide, the storage nitride, and the top oxide. The base oxide is thermally grown to the thickness of between about 3 and 6 nm, followed by putting the wafer in an NH$_3$ ambient at greater than 850° C. to allow nitridation on the surface. The nitridation process helps to reduce incubation time and deposit nitride uniformly. The nitride thickness deposited by a conventional chemical vapor deposition (CVD) tool depends on the top oxide formation, either deposition or oxidation of nitride. The final thickness, sandwiched between the bottom and top oxides, is controlled to be between about 3 and 6 nm. The top oxide is deposited to a thickness of between about 4 and 7 nm by a conventional CVD process, such as high temperature oxide (HTO). The deposition is followed by a wet oxidation process to stabilize the boundary surface of the top oxide with the overlying nitride. Alternatively, the nitride could be oxidized to form the top oxide layer. In this case, the nitride is deposited to a thickness of between about 6 and 9 nm to compensate for the loss of the nitride during oxidation. After oxidation, the nitride thickness becomes between about 3 and 5 nm and the top oxide will have a thickness of between about 4.5 and 7.5 nm. An in-situ steam generation (ISSG) tool is preferred for the oxidation to minimize effects on areas other than the ONO layer.

Figure 10:
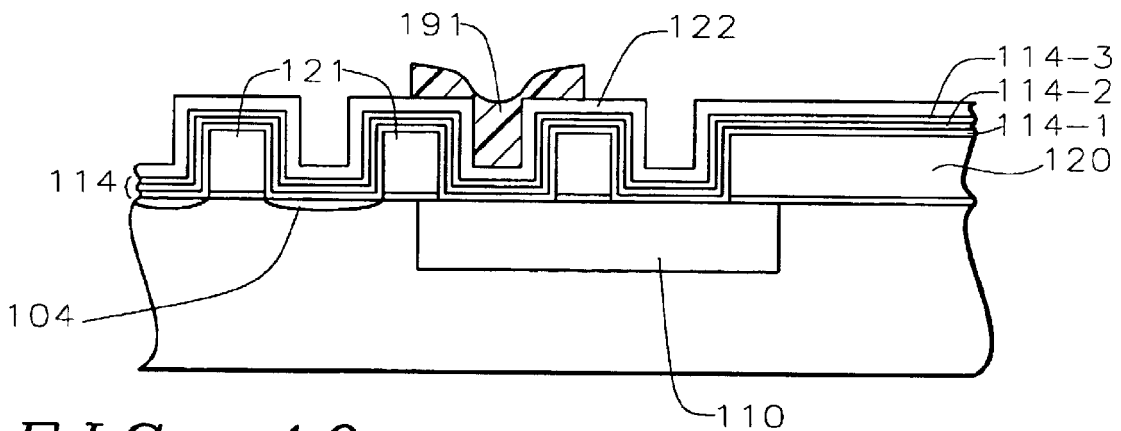
Figure 11:
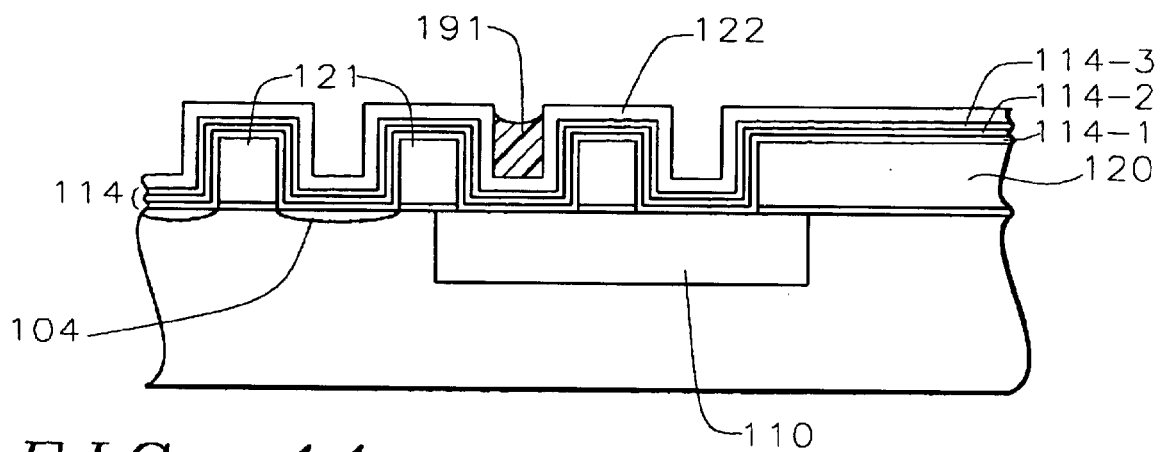
Figure 12:
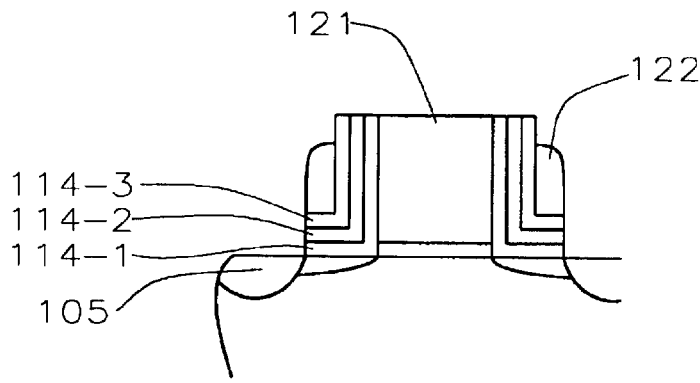
Figure 13:
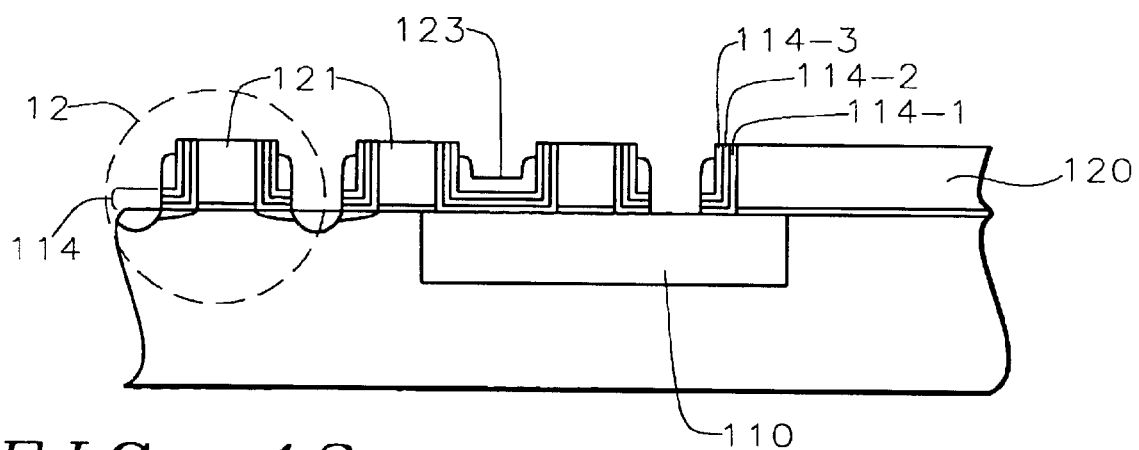

Now, a doped polysilicon layer 122 is deposited over the ONO layer 114 for the control gate. The layer 122 has a thickness of between about 40 and 60 nm. Alternatively, amorphous silicon can be used to reduce resistance. FIG. 12 is an enlarged view of the memory gate showing the completed control gates 122. The control gates 122 are formed by a conventional vertical reactive ion etch wherein the contact area is covered with a photoresist mask. The mask is unnecessary other than in the area of the gate contact. Since remaining polysilicon over the memory word gate will cause a short to the word gate in later processes, the photoresist should not remain there during etching. It is so difficult for the conventional lithography process to make a photoresist image covering the contact area only without any resist on top of the word gate, that this invention provides two embodiments to achieve self-aligned control gate contact pad formation. These are a resist recess process, as shown in FIGS. 9–11, and a poly plug process, as shown in FIGS. 12–15.

Figure 9:
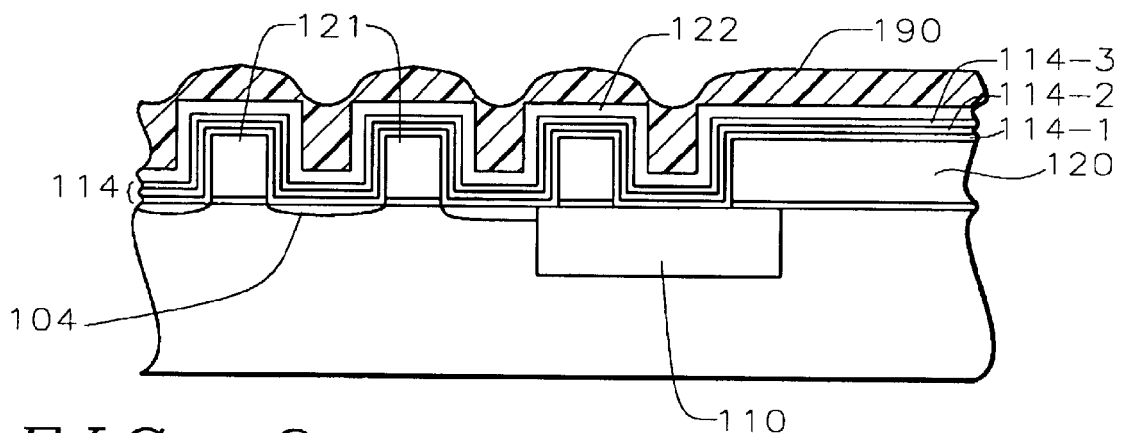

In the recessed resist process, a thin photoresist layer 190 is applied to plug the troughs between the word gates and to make a thickness difference between the top and bottom, as shown in FIG. 9. Unnecessary resist is developed out using conventional lithography to leave the resist 191 over the contact area as shown in FIG. 10. Etching down the resist with high selectivity to polysilicon, such as O₂ reactive ion etching, until the remaining resist over the word gate is etched away, we have the mask covering only the control gate contact area as shown in FIG. 11. A vertical reactive ion etch of the polysilicon or amorphous silicon 122 provides the structure shown in FIG. 13.

Figure 14:
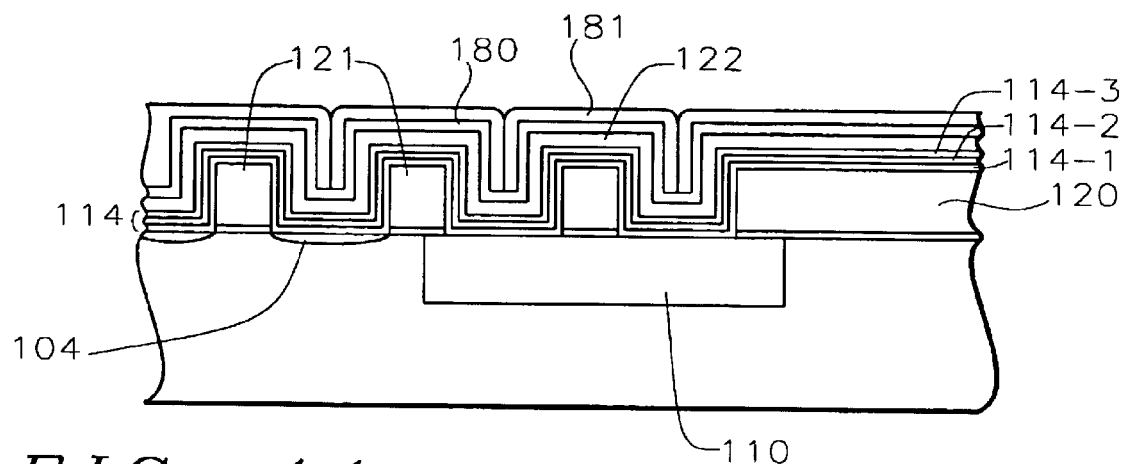
Figure 15:
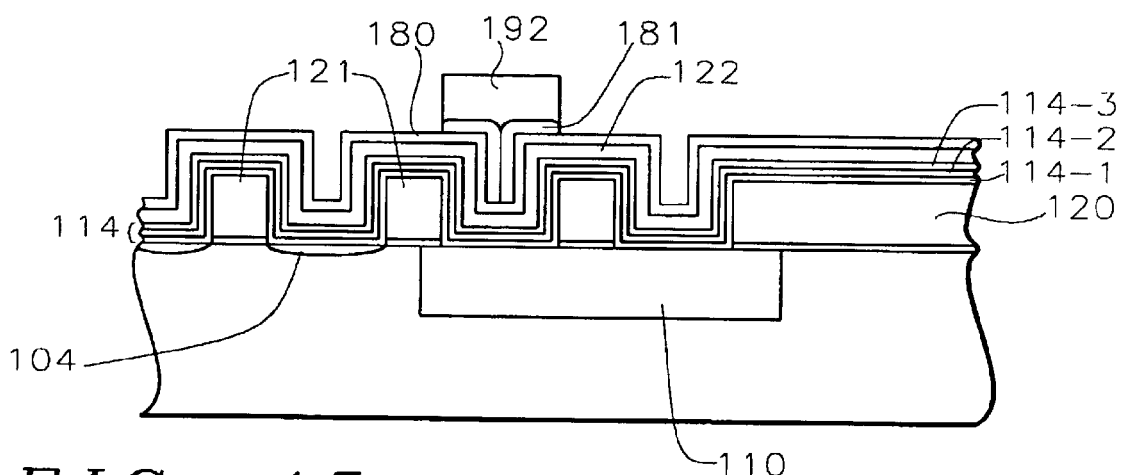
Figure 16:
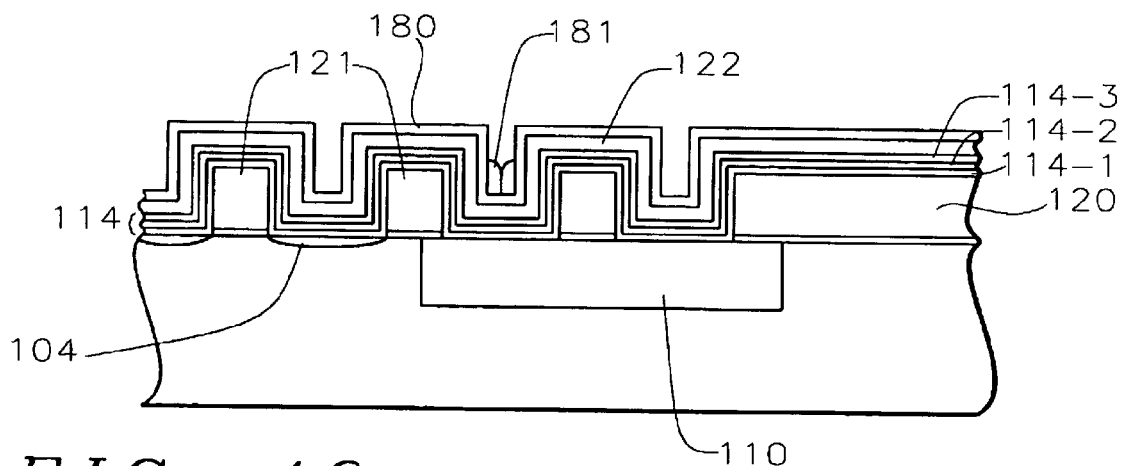
Figure 17:
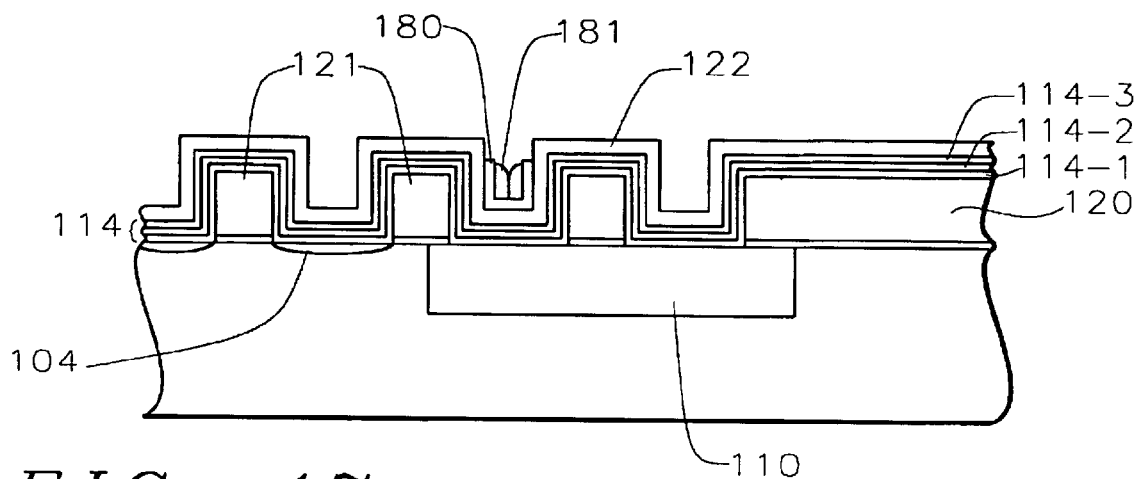
Figure 18:
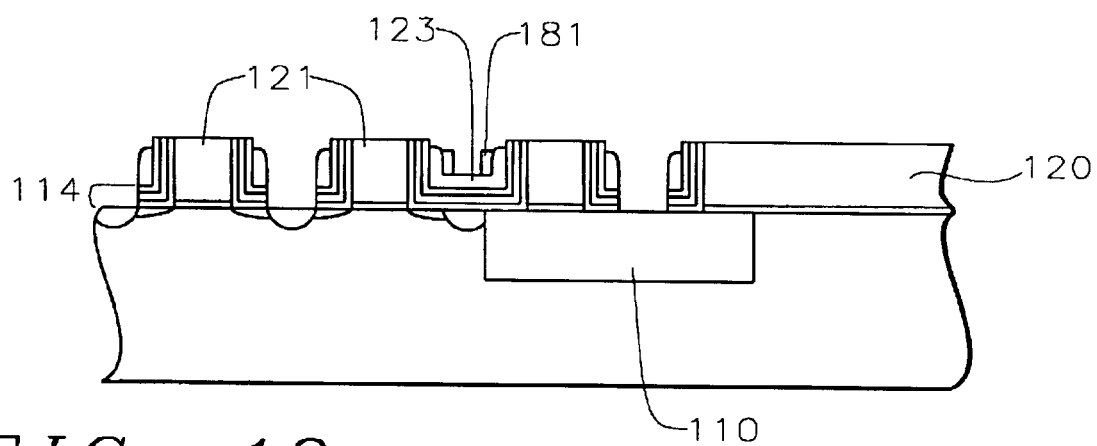

In the second embodiment of self-aligned control gate contact process, polysilicon is plugged in the control-gate contact instead of photo resist in the first embodiment. The control gate polysilicon 122 deposition as shown in FIG. 8 is followed by depositing etch stop oxide 180 to a thickness of between about 10 to 30 nm and plug polysilicon 181 to a thickness of between about 100 to 250 nm to fill between the control gates subsequently as shown in FIG. 14. The unnecessary plug polysilicon is etched away where it is not covered by photoresist mask 192 over the control gate pad area using conventional lithography as shown in FIG. 15. The photoresist mask is stripped and remaining polysilicon over the control gate is recessed with a vertical ion etch until the polysilicon on top is etched away as shown in FIG. 16. The oxide 181 not covered by the control gate contact is etched away with a conventional oxide wet etching as shown in FIG. 17. The oxide 181 overlying the control gate contact is masked with the plug polysilicon 180 so that it remains with the polysilicon after wet etching. The control gate polysilicon 122 is vertically etched with reactive ion etching followed by etching ONO subsequently. The plug polysilicon 181 overlying the control gate contact is etched away during the etching and stops at oxide 180 and oxide 180 is etched away during the ONO etching as shown in FIG. 18.

Figure 19:
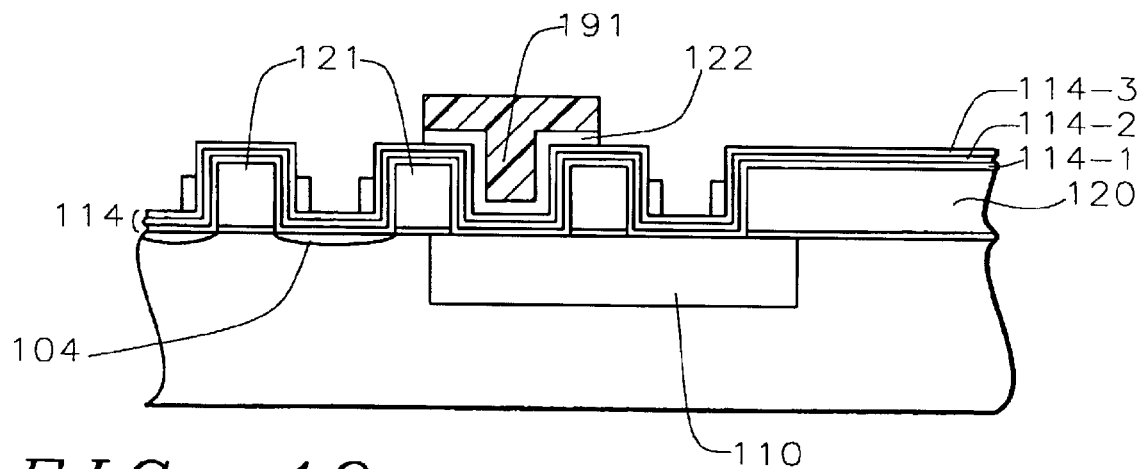
Figure 20:
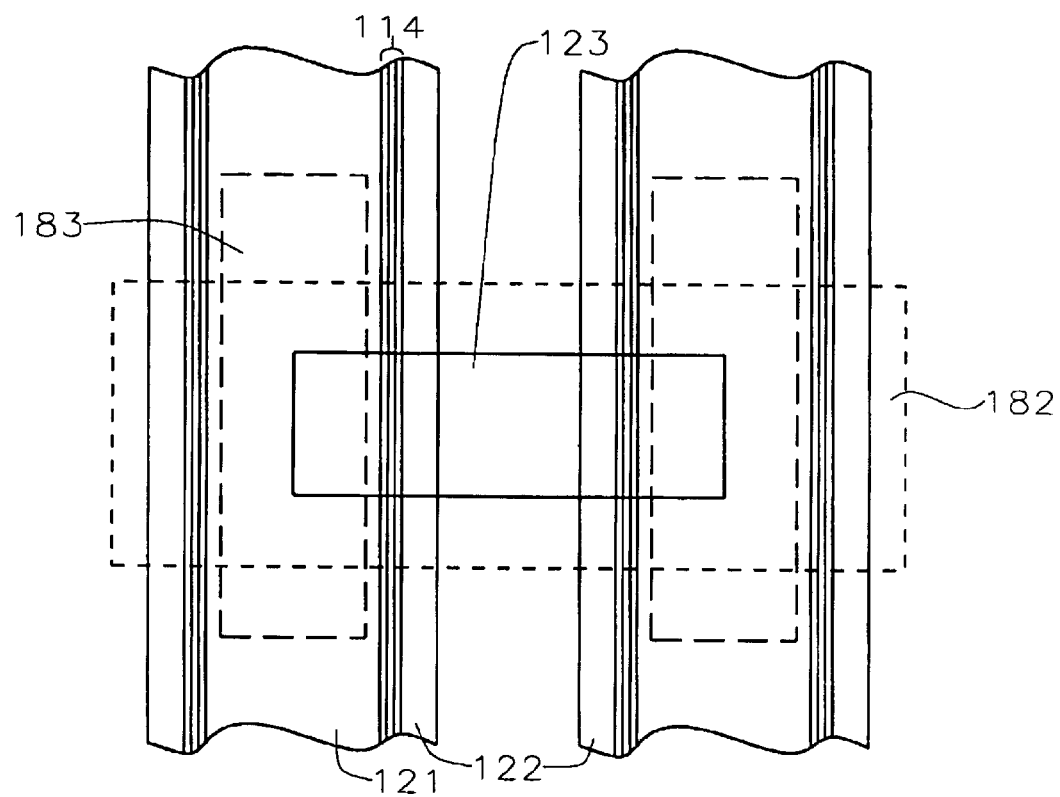
FIG. 20 shows a top view of the layout of the present invention.

It is also applicable to get the control gate pad directly using the photoresist mask without the self-aligned process as shown in FIG. 19, although it should pay an area penalty. The edge of the control gate pad on top of the word gate may get a short to the word gate at the salicidation process. Thus, this alternative is followed by placing a salicide block 182 to avoid word-control gate short and bridging over the non salicided word gate with M1 183 to recover the word gate resistance, as shown in FIG. 20.

Figure 21:
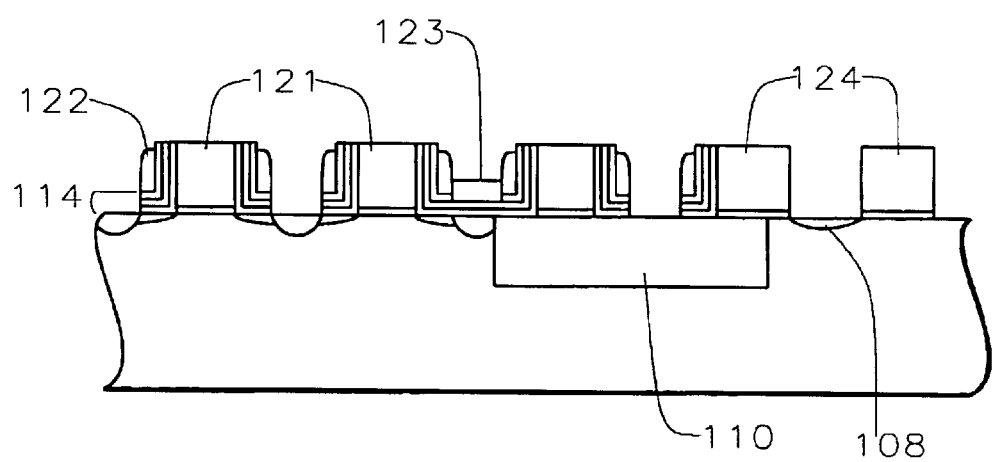
FIG. 21 shows the process flow of the present invention in cross-section.

In all embodiments, the control gate polysilicon is lowered more than 50 nm from the height of the word gate 121, forming a step with a height of between about 50 and 100 nm, as shown by 122 in FIG. 21. After cleaning and 3 to 6 nm sidewall oxidation to recover etching damage, N-type species are implanted to form memory LDD regions 105. For example, As may be implanted with an energy of about 15 KeV and dosage of between about 1E13 and 1E14 ions/cm².

Figure 22:
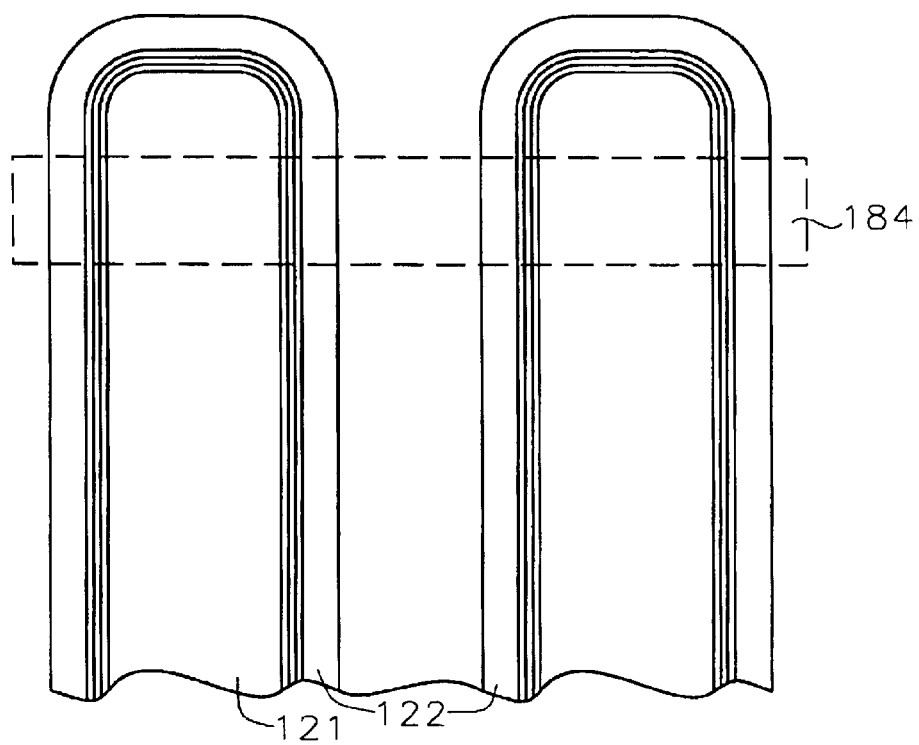
FIGS. 22 through 24 show a top view of the layout of the present invention.
Figure 23:
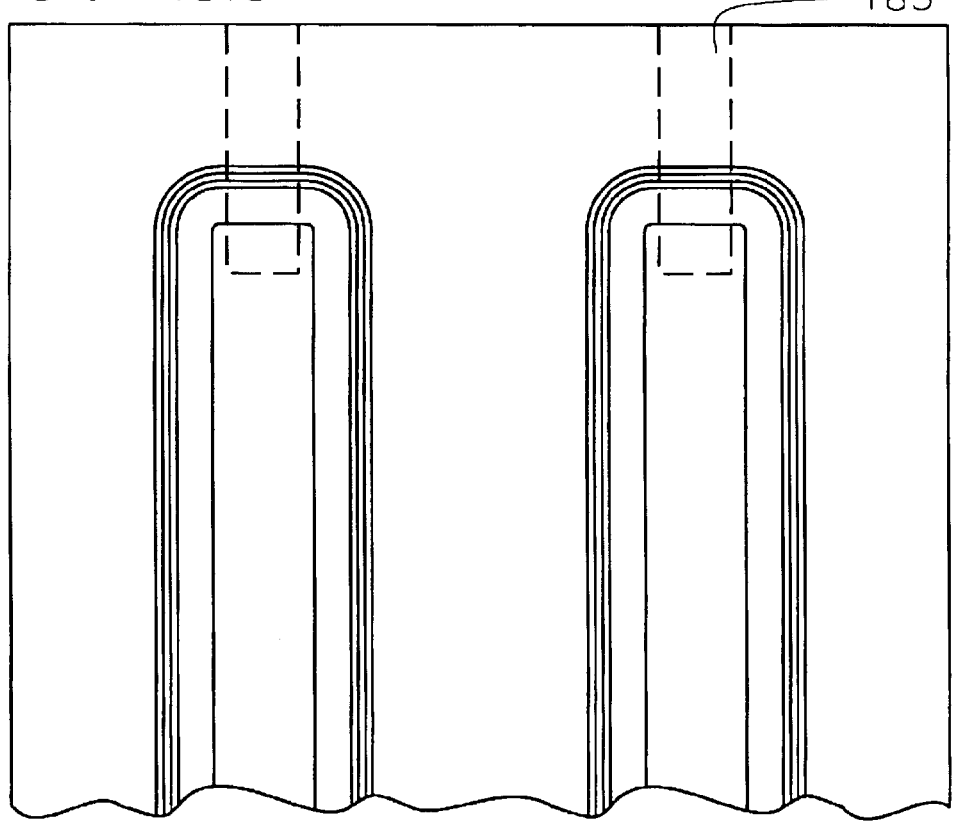

A channel length of the control gate is defined by the polysilicon remaining thickness after control gate poly etching. The program operation of the device assumes source side injection of channel hot electrons. The electrons are stored in the nitride along the whole channel area. While the erase operation is considered to be hot hole injection, hot holes can move only about 2 or 3 times of their mean free pass along the channel. If the channel length is too large, hot holes cannot reach the word gate side edge and they cannot cancel out the electrons stored at the edge of the gate. This would degrade the endurance performance of the device. The thickness therefore must be controlled to be 50 nm or less, and preferably 35 nm to 50 nm The process returns to the basic CMOS flow. All of the parameters are provided by the basic CMOS steps hereafter. After the memory LDD formation, CMOS gates are formed with a conventional lithography and reactive ion etching as shown in FIG. 21. The memory word gate is defined either as a polysilicon bar as shown in FIG. 22 or a trough in the polysilicon layer as shown in FIG. 23. The control gate 122 in FIG. 22 surrounds polysilicon bar 121. Since the control gate loops around the word line, CGi,l, left side control gate of i-th word gate and CGi,r, right side, are not separated before the logic etching. The control gate is etched at both ends of the word gate to separate CGi,l and CG.i,r by putting an opening 184 in the logic gate mask. CG gates CGi,r and CGi+1,l sharing a diffusion are connected with the control gate contact pad. The word gates in FIG. 23 are not separated before logic etching. Putting opening 185 in the logic gate mask, the word gates are separated.

Figure 24:
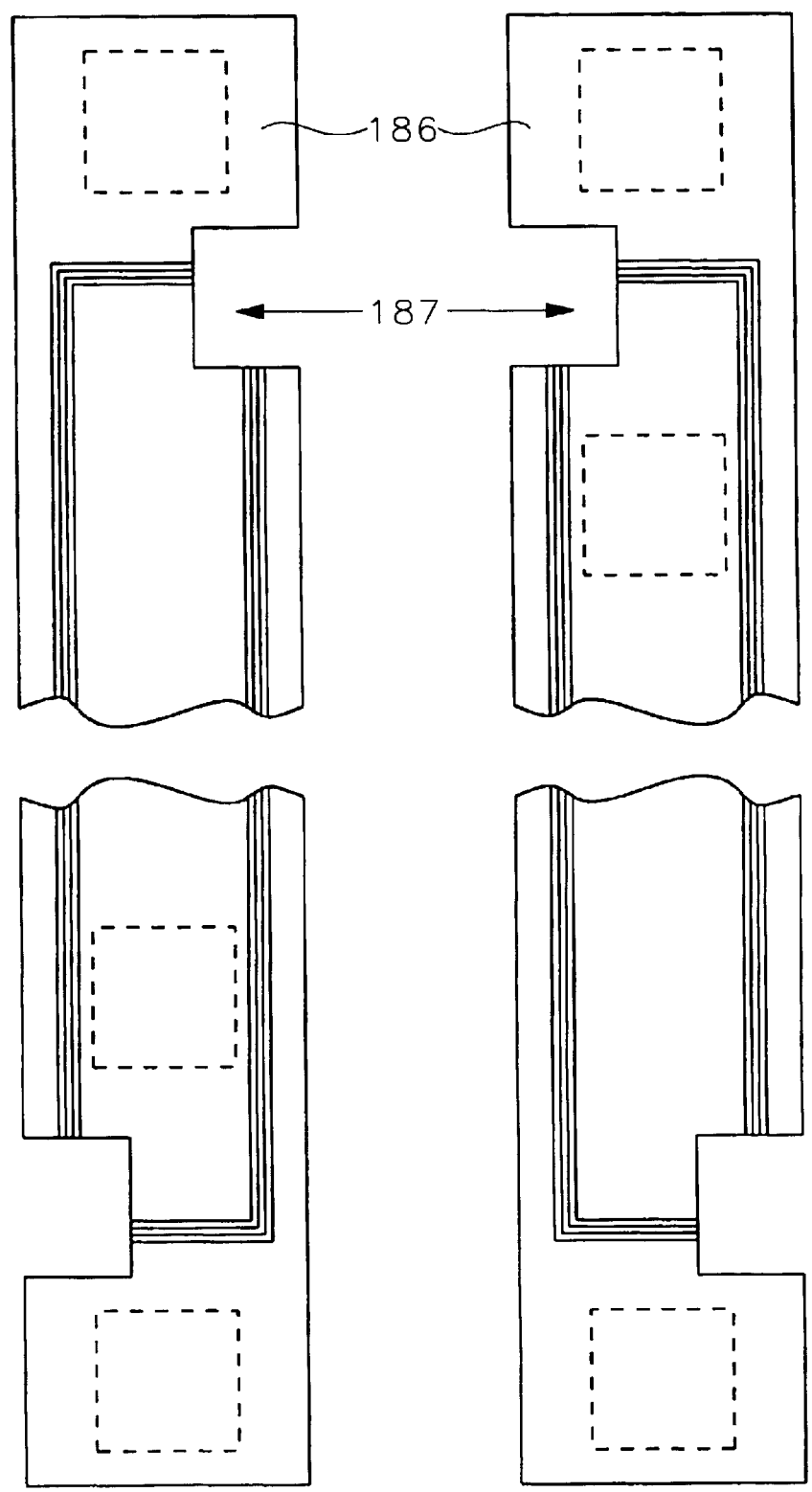

The control gate works together with another control gate sharing a diffusion area in this disclosure. Some applications may require each control gate to work independently. The top view structure in FIG. 24 enables each control gate to operate independently. The control gate pad 186 is formed at both ends of the word gate bar using a process shown in FIG. 19. The opening notch 187 is formed alternately with logic gate etching.

Figure 25:
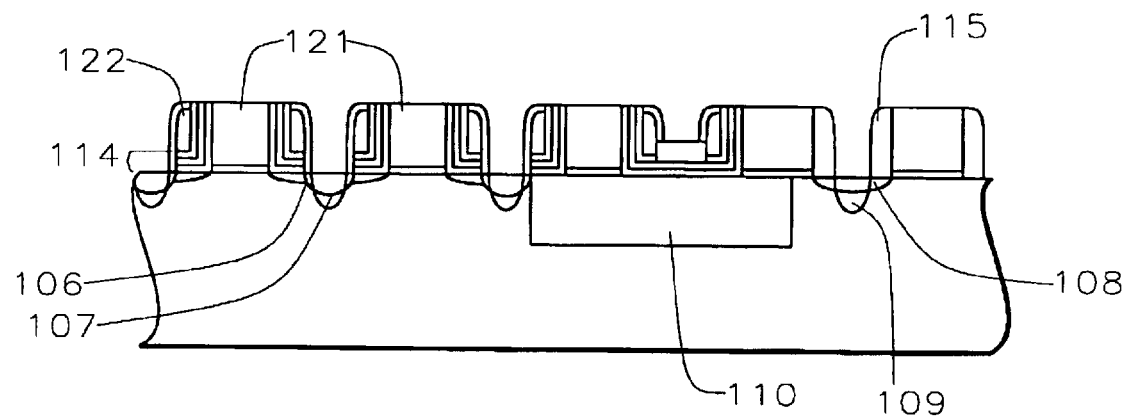
FIGS. 25 through 27 show the process flow of the present invention in cross-section.

NMOS and PMOS LDD implants are made individually as shown by 108 in FIG. 25. The spacer process is shared between the CMOS and memory areas. The spacer thickness 115 is much thicker than the control gate polysilicon 122. Since the control gate has the form of a shoulder, the entire control gate is covered by the spacer material and is not exposed. P-channel source and drain implants and N-channel source and drain implants are made subsequently. Memory source and drain implants 107 are shared with N-channel source/drain implants 109.

Figure 26:
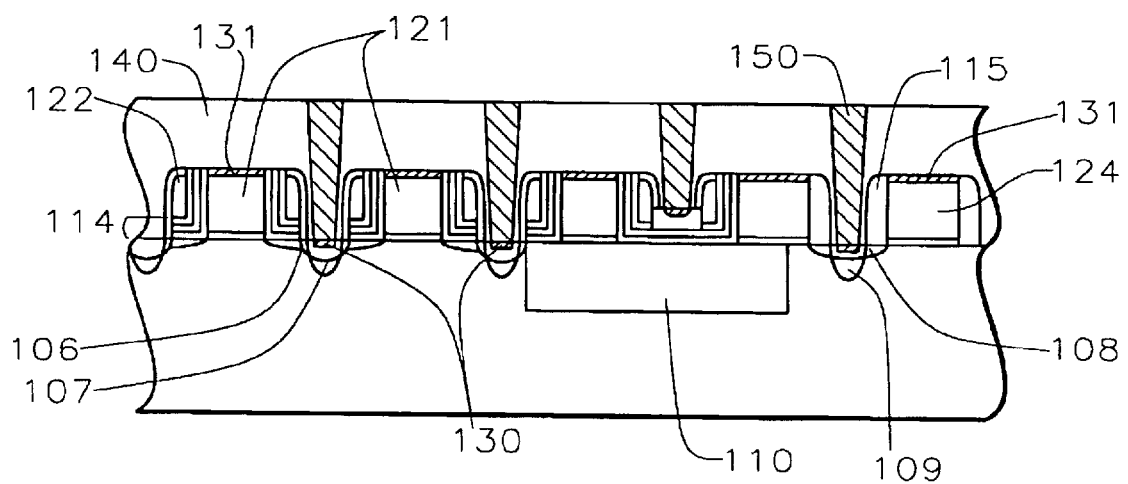
Figure 27:
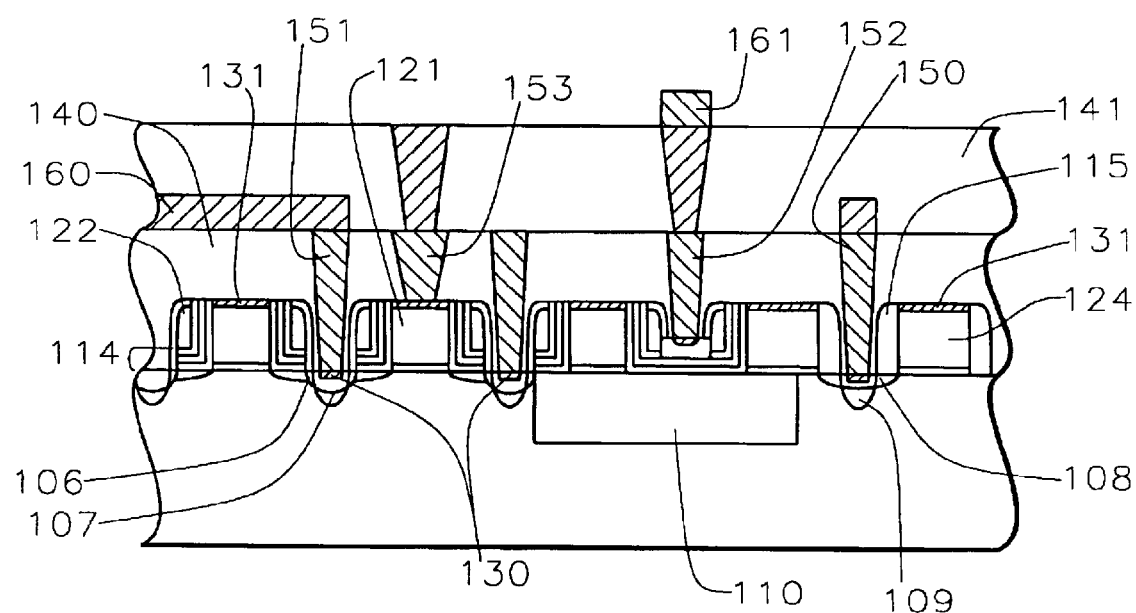

Salicide metal such as titanium or molybdenum is deposited and reacts with the silicon to form salicide during annealing. The memory word gates 121, memory diffusion 107, CMOS gates 124, and CMOS diffusion area 108 are converted to salicide. The control gate is not salicided because the gate is covered with spacer dielectrics. Diffusion salicide 130 and gate salicide 131 are shown in FIG. 26.

Oxide fill 140, chemical mechanical polishing (CMP), contact opening, metal 1 150, and following processes are basic CMOS process steps. An example of metal wiring layout is illustrated in top view in FIG. 28. The first metal 106 works as the bit line.

Figure 28:
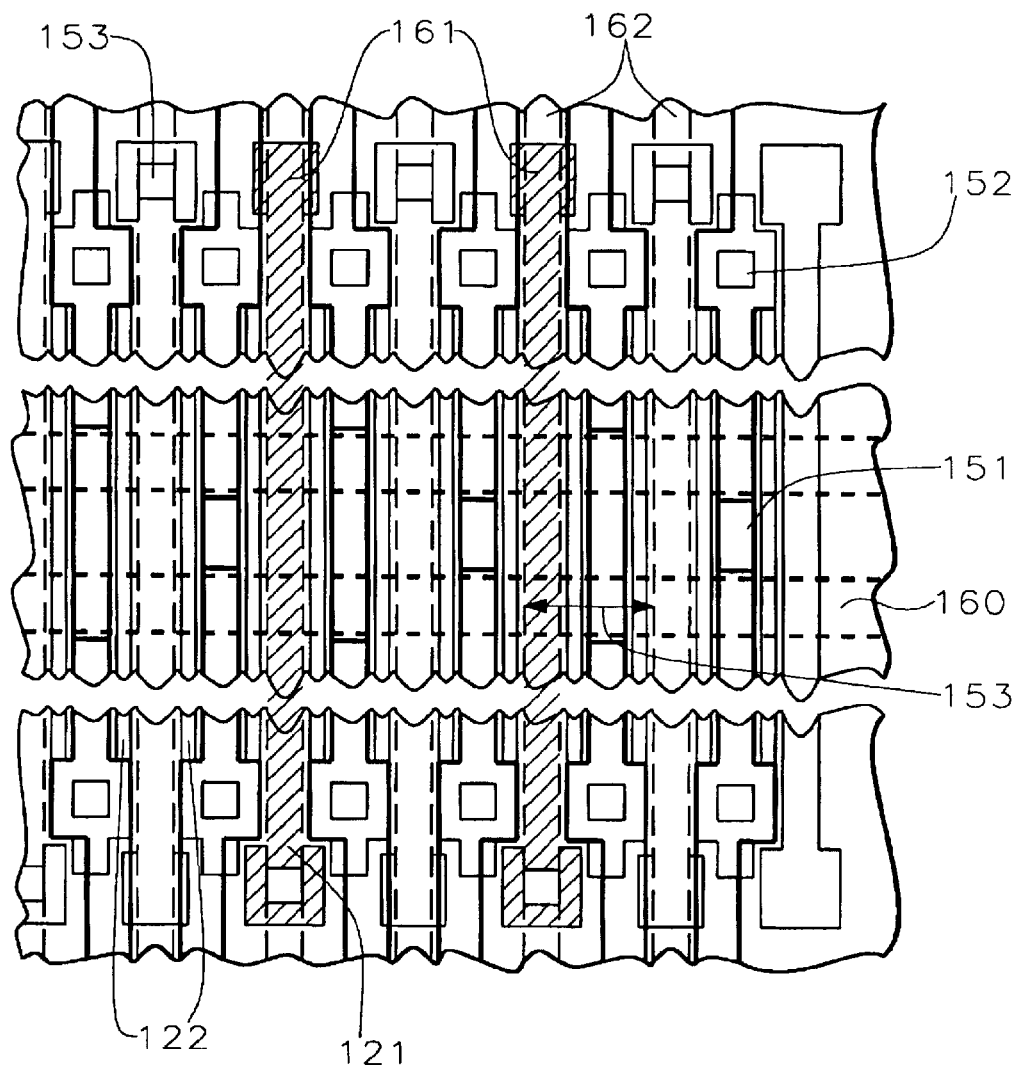
FIG. 28 shows a top view of the layout of the completed device of the present invention.

The memory array is divided into smaller blocks to enable flexible device operations. A metal line with low wired resistance stitches the blocks via corresponding contacts. Each word line contact 153 or control gate contact 152 is placed at the edges of each stitch block as shown in FIG. 28. Since the word line 121 and the control gate 122 run parallel and crossed to the bit line 160, the metal layer for their stitch lines should be different from the bit line. At least two metal levels are necessary to arrange the stitches. Another metal level is required to get a density benefit. Putting f as a minimum feature size in the design rule, word line minimum pitch is estimated by 3f; 1f of line width plus 1f of line to line space plus 2×0.5f of control gate width. Two metal stitch lines are required within the word line pitch; one for the word line and one for the shared adjacent control gate lines. Since metal pitch cannot be smaller than 2f, two metal stitich lines for the word line and the control gate designated with the minimum design rule cannot be on the same layer. Thus, two metal mask levels are necessary to stitch both word line and control gate to minimize the memory array size and maximize the memory density. The stitch contacts of control gate 152 and word line 151 cannot be arranged in a row because there is no way to keep a minimum space between a metal stitch line and contacts. Therefore, these contacts are arranged alternately shifting each other. While either word line contacts or control gate contacts can be placed on both sides of the block, the other contacts are placed on each side alternately for the stitch lines to detour. FIG. 28 is an example where the control gate contacts 152 are placed on both sides of the block and the word line contacts 153 are placed on top and bottom alternately, stitched by second metal 161 and third metal 162, respectively. The resistance of the control gate is supposed to be much higher than that of the word line. The first metal and thereafter are fabricated by a conventional metal wiring process, not shown.

While the invention has been particularly shown and described with reference to the preferred embodiments thereof, it will be understood by those skilled in the art that various changes in form and details may be made without departing from the spirit and scope of the invention.

What is claimed is:

1. A method to fabricate a twin MONOS memory in a CMOS process comprising:
    providing a memory area and a CMOS area separated by isolation regions in a substrate;
    forming a deep N-well in said memory area;
    providing a gate oxide layer on said substrate;
    depositing a first polysilicon layer overlying said gate oxide layer;
    patterning said first polysilicon layer in said memory area to form memory gates;
    forming an oxide-nitride-oxide (ONO) layer overlying said first polysilicon layer and said memory gates;
    depositing a second silicon layer overlying said first polysilicon layer and said memory gates;
    vertically etching away said second silicon layer to leave said second silicon layer as sidewalls on said memory gates and on said first polysilicon layer in said CMOS area wherein said sidewalls on said memory gates form control gates wherein said nitride portion of said ONO layer underlying said control gates will provide storage in said memory area and wherein said control gates have a height of at least 50 nm less than a height of said memory gates and wherein a control gate contact pad is formed between two of said memory gates comprising said sidewall control gates and a portion of said second silicon layer on a surface of said substrate contacting said sidewall control gates;
    thereafter patterning said first polysilicon layer in said CMOS area to form CMOS gates;
    forming source and drain regions in said CMOS area and in said memory area;
    covering said CMOS gate and said memory gates with a dielectric layer; and
    making contacts through said dielectric layer to said source and drain regions to form word line contacts and control gate contacts to complete said Twin MONOS memory device.

2. The method according to claim 1 wherein said first polysilicon layer has a thickness of between about 100 and 250 nm.

3. The method according to claim 1 further comprising performing a threshold voltage adjustment ion implantation into said substrate not covered by said memory gates and said first polysilicon layer after said step of patterning said memory gates.

4. The method according to claim 1 wherein said step of forming said oxide-nitride-oxide (ONO) layer comprises:
    thermally growing a base oxide layer on surfaces of said substrate, said memory gates, and said first polysilicon layer;
    nitridizing said base oxide surface in a $NH_3$ ambient;
    thereafter depositing a nitride layer overlying said nitridized base oxide layer;
    depositing a top oxide layer overlying said nitride layer; and
    oxidizing said nitride layer to stabilize a boundary between about nitride layer and said top oxide layer.

5. The method according to claim 1 wherein said step of forming said oxide-nitride-oxide (ONO) layer comprises:
    thermally growing a base oxide layer on surfaces of said substrate, said memory gates, and said first polysilicon layer;
    nitridizing said base oxide surface in a $NH_3$ ambient;
    thereafter depositing a nitride layer overlying said nitridized base oxide layer; and
    oxidizing said nitride layer to form a top oxide layer overlying said nitride layer.

6. The method according to claim 1 wherein said second silicon layer comprises polysilicon or amorphous silicon having a thickness of between about 40 and 60 nm.

7. The method according to claim 1 wherein said step of vertically etching away said second silicon layer to form said control gates comprises:

coating a photoresist layer over said second silicon layer to fill spaces between said memory gates and said first polysilicon layer;

developing away said photoresist except overlying an area said two of said memory gates wherein said area is a control gate contact area;

etching down said photoresist layer with a high selectivity to silicon thereby leaving said photoresist only within said space covering said control gate contact area; and thereafter vertically etching away said second silicon layer to form said control gates on sidewalls of said memory gates and to form said control gate contact pad on sidewalls and on a surface of said substrate in said control gate contact area.

8. The method according to claim 1 wherein said step of vertically etching away said second silicon layer to form said control gates comprises:

depositing an oxide layer over said second silicon layer to stop polysilicon etching;

depositing a third polysilicon layer over said oxide layer to fill spaces between said memory gates;

coating photoresist over said third polysilicon layer and developing away said photoresist except overlying an area between said two of said memory gates wherein said area is a control gate contact area;

etching down said third polysilicon layer to said oxide layer thereby leaving said third polysilicon only within said space covering said control gate contact area;

removing exposed said oxide layer with wet etching; and thereafter vertically etching away said second silicon layer to form said control gates on sidewalls of said memory gates and to form said control gate contact pad on sidewalls and on a surface of said substrate in said control gate contact area.

9. The method according to claim 1 wherein said step of vertically etching away said second silicon layer to form said control gates comprises:

coating a photoresist layer over said second silicon layer;

developing away said photoresist except overlying an area between said two of said memory gates wherein said area is a control gate contact area;

vertically etching away said second silicon layer to form said control gates on sidewalls of said memory gates and to form said control gate contact pad on sidewalls and on a surface of said substrate in said control gate contact area;

blocking said control gate contact cover from salicidation to avoid word-control gate short with salicide; and bridging salicide protected word line with metal.

10. The method according to claim 1 wherein said control gate contact pad is placed on both ends of said word line and wherein said control gate contact and said word gate contact are placed together on at least one end of said word line.

11. The method according to claim 1 after said step of forming said control gates and prior to said step of patterning said CMOS gates, further comprising implanting ions to form LDD regions in said memory area.

12. The method according to claim 1 wherein a channel length of said control gate is less than 50 nm.

13. The method according to claim 1 during said step of patterning said first polysilicon layer in said CMOS area to form CMOS gates further comprising cutting said control gate looping around said word gate to separate said control gate.

14. The method according to claim 1 further comprising saliciding said memory gates, said CMOS gates, and said source and drain regions in said memory and CMOS areas.

15. A method to fabricate a twin MONOS memory in a CMOS process comprising:

providing a memory area and a CMOS area separated by isolation regions in a substrate;

forming a deep N-well in said memory area;

providing a gate oxide layer on said substrate;

depositing a first polysilicon layer overlying said gate oxide layer;

patterning said first polysilicon layer in said memory area to form memory gates;

forming an oxide-nitride-oxide (ONO) layer overlying said first polysilicon layer and said memory gates;

depositing a second silicon layer overlying said first polysilicon layer and said memory gates;

vertically etching away said second silicon layer to leave said second silicon layer as sidewalls on said memory gates and on said first polysilicon layer in said CMOS area wherein said sidewalls on said memory gates form control gates wherein said nitride portion of said ONO layer underlying said control gates will provide storage in said memory area, wherein a channel length of said control gates is less than 50 nm, and; wherein said control gates have a height of at least 50 nm less than a height of said memory gates and wherein a control gate contact pad is formed between two of said memory gates comprising said sidewall control gates and a portion of said second silicon layer on a surface of said substrate contacting said sidewall control gates;

thereafter patterning said first polysilicon layer in said CMOS area to form CMOS gates;

forming source and drain regions in said CMOS area and in said memory area;

covering said CMOS gate and said memory gates with a dielectric layer; and making contacts through said dielectric layer to said source and drain regions to form word line contacts and control gate contacts to complete said Twin MONOS memory device.

16. The method according to claim 15 wherein said first polysilicon layer has a thickness of between about 100 and 250 nm.

17. The method according to claim 15 further comprising performing a threshold voltage adjustment ion implantation into said substrate not covered by said memory gates and said first polysilicon layer after said step of patterning said memory gates.

18. The method according to claim 15 wherein said step of forming said oxide-nitride-oxide (ONO) layer comprises:

thermally growing a base oxide layer on surfaces of said substrate, said memory gates, and said first polysilicon layer;

nitridizing said base oxide layer in a $NH_3$ ambient;

depositing a nitride layer overlying said nitridized base oxide layer;

depositing a top oxide layer overlying said nitride layer; and oxidizing said nitride layer to stabilize a boundary between said nitride layer and said top oxide layer.

19. The method according to claim 15 wherein said step of forming said oxide-nitride-oxide (ONO) layer comprises:

thermally growing a base oxide layer on surfaces of said substrate, said memory gates, and said first polysilicon layer;

nitridizing said base oxide layer in a $NH_3$ ambient;

depositing nitride layer overlying said nitridized base oxide layer; and oxidizing said nitride layer to form a top oxide layer overlying said nitride layer.

20. The method according to claim 15 wherein said second silicon layer comprises polysilicon or amorphous silicon having a thickness of between about 40 and 60 nm.

21. The method according to claim 15 wherein said step of vertically etching away said second silicon layer to form said control gates comprises:

coating a photoresist layer over said second silicon layer to fill spaces between said memory gates and said first polysilicon layer;

developing away said photoresist except overlying an area between said two of said memory gates wherein said area is a control gate contact area;

etching down said photoresist layer with a high selectivity to silicon thereby leaving said photoresist only within said space covering said control gate contact area; and thereafter vertically etching away said second silicon layer to form said control gates on sidewalls of said memory gates and to form said control gate contact pad on sidewalls and on a surface of said substrate in said control gate contact area.

22. The method according to claim 15 wherein said step of vertically etching away said second silicon layer to form said control gates comprises:

depositing an oxide layer over said second silicon layer to stop polysilicon etching;

depositing a third polysilicon layer over said oxide layer to fill spaces between said memory gates;

coating photoresist over said third polysilicon layer and developing away said photoresist except overlying an area between said two of said memory gates wherein said area is a control gate contact area;

etching down said third polysilicon layer to said oxide layer thereby leaving said third polysilicon only within said space covering said control gate contact area;

removing exposed said oxide layer with wet etching; and thereafter vertically etching away said second silicon layer to form said control gates on sidewalls of said memory gates and to form said control gate contact pad on sidewalls and on a surface of said substrate in said control gate contact area.

23. The method according to claim 15 wherein said step of vertically etching away said second silicon layer to form said control gates comprises:

coating a photoresist layer over said second silicon layer;

developing away said photoresist except overlying an area between said two of said memory gates wherein said area is a control gate contact area;

vertically etching away said second silicon layer to form said control gates on sidewalls of said memory gates and to form said control gate contact pad on sidewalls and on a surface of said substrate in said control gate contact area;

blocking said control gate contact cover from salicidation to avoid word-control gate short with salicide; and bridging salicide protected word line with metal.

24. The method according to claim 15 wherein said control gate contact pad is placed on both ends of said word line and wherein said control gate contact and said word gate contact are placed together on at least one end of said word line.

25. The method according to claim 15 after said step of forming said control gates and prior to said step of patterning said CMOS gates, further comprising implanting ions to form LDD regions in said memory area.

26. The method according to claim 15 during said step of patterning said first polysilicon layer in said CMOS area to form CMOS gates further comprising cutting said control gate looping around said word gate to separate said control gate.

27. The method according to claim 15 further comprising saliciding said memory gates, said CMOS gates, and said source and drain regions in said memory and CMOS areas.

28. A method to fabricate a twin MONOS memory in a CMOS process comprising:

providing a memory area and a CMOS area separated by isolation regions in a substrate;

forming a deep N-well in said memory area;

providing a gate oxide layer on said substrate;

depositing a first polysilicon layer overlying said gate oxide layer;

patterning said first polysilicon layer in said memory area to form memory gates;

forming an oxide-nitride-oxide (ONO) layer overlying said first polysilicon layer and said memory gates;

depositing a second silicon layer overlying said first polysilicon layer and said memory gates;

coating a photoresist layer over said second silicon layer to fill spaces between said memory gates and said first polysilicon layer;

developing away said photoresist except overlying an area between two of said memory gates wherein said area is a control gate contact area;

etching down said photoresist layer with a high selectivity to silicon thereby leaving said photoresist only within said space covering said control gate contact area;

thereafter vertically etching away said second silicon layer to leave said second silicon layer as sidewalls on said memory gates and on said first polysilicon layer in said CMOS area wherein said sidewalls on said memory gates form control gates and wherein a control gate contact pad is formed on sidewalls and on a surface of said substrate in said control gate contact area, wherein said nitride portion of said ONO layer underlying said control gates will provide storage in said memory area, wherein a channel length of said control gates is less than 50 nm, and wherein said control gates have a height of at least 50 nm less than a height of said memory gates;

thereafter patterning said first polysilicon layer in said CMOS area to form CMOS gates;

forming source and drain regions in said CMOS area and in said memory area;

covering said CMOS gate and said memory gates with a dielectric layer; and making contacts through said dielectric layer to said source and drain regions to form word line contacts and control gate contacts to complete said Twin MONOS memory device.

29. The method according to claim 28 wherein said first polysilicon layer has a thickness of between about 100 and 250 nm.

30. The method according to claim 28 further comprising performing a threshold voltage adjustment ion implantation into said substrate not covered by said memory gates and said first polysilicon layer after said step of patterning said memory gates.

31. The method according to claim 28 wherein said step of forming said oxide-nitride-oxide (ONO) layer comprises:
thermally growing a base oxide layer on surfaces of said substrate, said memory gates, and said first polysilicon layer;
nitridizing said base oxide layer in a $NH_3$ ambient;
depositing a nitride layer overlying said nitridized base oxide layer;
depositing a top oxide layer overlying said nitride layer; and
oxidizing said nitride layer to stabilize a boundary between about nitride layer and said top oxide layer.

32. The method according to claim 28 wherein said step of forming said oxide-nitride-oxide (ONO) layer comprises:
thermally growing a base oxide layer on surfaces of said substrate, said memory gates, and said first polysilicon layer;
nitridizing said base oxide layer in a $NH_3$ ambient;
depositing a nitride layer overlying said nitridized base oxide layer; and
oxidizing said substrate to form a top oxide layer overlying said nitride layer.

33. The method according to claim 28 wherein said second silicon layer comprises polysilicon or amorphous silicon having a thickness of between about 40 and 60 nm.

34. The method according to claim 28 wherein said control gate contact pad is placed on an edge of said word gate and wherein said control gate contact and said word gate contact are placed together on at least one end of said word line.

35. The method according to claim 28 after said step of forming said control gates and prior to said step of patterning said CMOS gates, further comprising implanting ions to form LDD regions in said memory area.

36. The method according to claim 28 during said step of patterning said first polysilicon layer in said CMOS area to form CMOS gates further comprising cutting said control gate looping around said word gate to separate said control gate.

37. The method according to claim 28 further comprising saliciding said memory gates, said CMOS gates, and said source and drain regions in said memory and CMOS areas.

38. A method to fabricate a twin MONOS memory in a CMOS process comprising:
providing a memory area and a CMOS area separated by isolation regions in a substrate;
forming a deep N-well in said memory area;
providing a gate oxide layer on said substrate;
depositing a first polysilicon layer overlying said gate oxide layer;
patterning said first polysilicon layer in said memory area to form memory gates;
forming an oxide-nitride-oxide (ONO) layer overlying said first polysilicon layer and said memory gates;
depositing a second silicon layer overlying said first polysilicon layer and said memory gates;
depositing an oxide layer over said second silicon layer to stop polysilicon etching;
depositing a third polysilicon layer over said oxide layer to fill spaces between said memory gates;
coating photoresist over said third polysilicon layer and developing away said photoresist except overlying an area between two of said memory gates wherein said area is a control gate contact area;
etching down said third polysilicon layer to said oxide layer thereby leaving said third polysilicon only within said space covering said control gate contact area;
removing exposed said oxide layer with wet etching;
thereafter vertically etching away said second silicon layer to leave said second silicon layer as sidewalls on said memory gates and on said first polysilicon layer in said CMOS area wherein said sidewalls on said memory gates form control gates and wherein a control gate contact pad is formed on sidewalls and on a surface of said substrate in said control gate contact area, wherein said nitride portion of said ONO layer underlying said control gates will provide storage in said memory area, wherein a channel length of said control gates is less than 50 nm, and wherein said control gates have a height of at least 50 nm less than a height of said memory gates;
thereafter patterning said first polysilicon layer in said CMOS area to form CMOS gates;
forming source and drain regions in said CMOS area and in said memory area;
covering said CMOS gate and said memory gates with a dielectric layer; and
making contacts through said dielectric layer to said source and drain regions to form word line contacts and control gate contacts to complete said Twin MONOS memory device.

39. The method according to claim 38 wherein said first polysilicon layer has a thickness of between about 100 and 250 nm.

40. The method according to claim 38 further comprising performing a threshold voltage adjustment ion implantation into said substrate not covered by said memory gates and said first polysilicon layer after said step of patterning said memory gates.

41. The method according to claim 38 wherein said step of forming said oxide-nitride-oxide (ONO) layer comprises:
thermally growing a base oxide layer on surfaces of said substrate, said memory gates, and said first polysilicon layer;
nitridizing said base oxide layer in a $NH_3$ ambient;
depositing a nitride layer overlying said nitridized base oxide layer;
depositing a top oxide layer overlying said nitride layer; and
oxidizing said nitride layer to stabilize a boundary between about nitride layer and said top oxide layer.

42. The method according to claim 38 wherein said step of forming said oxide-nitride-oxide (ONO) layer comprises:
thermally growing a base oxide layer on surfaces of said substrate, said memory gates, and said first polysilicon layer;
nitridizing said base oxide layer in a $NH_3$ ambient;
depositing a nitride layer overlying said nitridized base oxide layer; and
oxidizing said substrate to form a top oxide layer overlying said nitride layer.

43. The method according to claim 38 wherein said second silicon layer comprises polysilicon or amorphous silicon having a thickness of between about 40 and 60 nm.

44. The method according to claim 38 wherein said control gate contact pad is placed on both ends of said word line and wherein said control gate contact and said word gate contact are placed together on at least one end of said word line.

45. The method according to claim 38 after said step of forming said control gates and prior to said step of patterning said CMOS gates, further comprising implanting ions to form LDD regions in said memory area.

46. The method according to claim 38 during said step of patterning said first polysilicon layer in said CMOS area to form CMOS gates further comprising cutting said control gate looping around said word gate to separate said control gate.

47. The method according to claim 38 further comprising saliciding said memory gates, said CMOS gates, and said source and drain regions in said memory and CMOS areas.

48. A method to fabricate a twin MONOS memory in a CMOS process comprising:

provide a memory area and a CMOS area separated by isolation regions in a substrate;

forming a deep N-well in said memory area;

providing a gate oxide layer on said substrate;

depositing a first polysilicon layer overlying said gate oxide layer;

patterning said first polysilicon layer in said memory area to form memory gates;

forming an oxide-nitride-oxide (ONO) layer overlying said first polysilicon layer and said memory gates;

depositing a second silicon layer overlying said first polysilicon layer and said memory gates;

coating a photoresist layer over said second silicon layer;

developing away said photoresist except overlying an area between two of said memory gates wherein said area is a control gate contact area;

vertically etching away said second silicon layer to leave said second silicon layer as sidewalls on said memory gates and on said first polysilicon layer in said CMOS area wherein said sidewalls on said memory gates form control gates and wherein a control gate contact pad is formed on sidewalls and on a surface of said substrate in said control gate contact area, wherein said nitride portion of said ONO layer underlying said control gates will provide storage in said memory area, wherein a channel length of said control gates is less than 50 nm, and wherein said control gates have a height of at least 50 nm less than a height of said memory gates;

blocking said control gate contact pad from salicidation to avoid word-control gate short with salicide;

thereafter patterning said first polysilicon layer in said CMOS area to form CMOS gates;

forming source and drain regions in said CMOS area and in said memory area;

covering said CMOS gate and said memory gates with a dielectric layer; and saliciding said memory gates, said CMOS gates, and said source and drain regions in said memory and CMOS areas;

making contacts through said dielectric layer to said source and drain regions to form word line contacts and control gate contacts; and bridging salicide protected word line with metal to complete said Twin MONOS memory device.

49. The method according to claim 48 wherein said first polysilicon layer has a thickness of between about 100 and 250 nm.

50. The method according to claim 48 further comprising performing a threshold voltage adjustment ion implantation into said substrate not covered by said memory gates and said first polysilicon layer after said step of patterning said memory gates.

51. The method according to claim 48 wherein said step of forming said oxide-nitride-oxide (ONO) layer comprises:

thermally growing a base oxide layer on surfaces of said substrate, said memory gates, and said first polysilicon layer;

nitridizing said base oxide layer in a $NH_3$ ambient;

depositing a nitride layer overlying said nitridized base oxide layer;

depositing a top oxide layer overlying said nitride layer; and oxidizing said nitride layer to stabilize a boundary between about nitride layer and said top oxide layer.

52. The method according to claim 48 wherein said step of forming said oxide-nitride-oxide (ONO) layer comprises:

thermally growing a base oxide layer on surfaces of said substrate, said memory gates, and said first polysilicon layer;

nitridizing said base oxide layer in a $NH_3$ ambient;

depositing a nitride layer overlying said nitridized base oxide layer; and oxidizing said substrate to form a top oxide layer overlying said nitride layer.

53. The method according to claim 48 wherein said second silicon layer comprises polysilicon or amorphous silicon having a thickness of between about 40 and 60 nm.

54. The method according to claim 48 wherein said control gate contact pad is placed on both ends of said word line and wherein said control gate contact and said word gate contact are placed together on at least one end of said word line.

55. The method according to claim 48 after said step of forming said control gates and prior to said step of patterning said CMOS gates, further comprising implanting ions to form LDD regions in said memory area.

56. The method according to claim 48 during said step of patterning said first polysilicon layer in said CMOS area to form CMOS gates further comprising cutting said control gate looping around said word gate to separate said control gate.

* * * * *